United States Patent
Hsu et al.

(10) Patent No.: US 10,204,826 B1
(45) Date of Patent: Feb. 12, 2019

(54) METHOD FOR REMOVING DAMAGED LAYER EMBEDDED IN A DIELECTRIC LAYER

(71) Applicant: UNITED MICROELECTRONICS CORP., Hsin-Chu (TW)

(72) Inventors: Min-Shiang Hsu, Kaohsiung (TW); Yuan-Fu Ko, Tainan (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/893,711

(22) Filed: Feb. 12, 2018

(30) Foreign Application Priority Data

Jan. 18, 2018 (CN) .......................... 2018 1 0048650

(51) Int. Cl.
| | |
|---|---|
| H01L 21/768 | (2006.01) |
| H01L 21/02 | (2006.01) |
| H01L 23/522 | (2006.01) |
| H01L 21/8234 | (2006.01) |
| H01L 23/532 | (2006.01) |
| H01L 23/528 | (2006.01) |
| H01L 21/311 | (2006.01) |
| H01L 21/321 | (2006.01) |

(52) U.S. Cl.
CPC .. *H01L 21/76814* (2013.01); *H01L 21/02063* (2013.01); *H01L 21/02178* (2013.01); *H01L 21/7682* (2013.01); *H01L 21/7684* (2013.01); *H01L 21/76802* (2013.01); *H01L 21/76825* (2013.01); *H01L 21/76831* (2013.01); *H01L 21/76877* (2013.01); *H01L 21/823475* (2013.01); *H01L 23/528* (2013.01); *H01L 23/5226* (2013.01); *H01L 23/53295* (2013.01); *H01L 21/31116* (2013.01); *H01L 21/31144* (2013.01); *H01L 21/3212* (2013.01); *H01L 21/76843* (2013.01); *H01L 21/823431* (2013.01)

(58) Field of Classification Search
None
See application file for complete search history.

(56) References Cited

U.S. PATENT DOCUMENTS

| | | | |
|---|---|---|---|
| 7,566,656 B2 | 7/2009 | Liu et al. | |
| 8,030,202 B1 | 10/2011 | Horak et al. | |
| 2006/0030128 A1* | 2/2006 | Bu | H01L 21/76807 438/462 |
| 2009/0104571 A1* | 4/2009 | Liu | H01L 21/31127 430/327 |
| 2009/0134517 A1* | 5/2009 | Usui | H01L 21/7682 257/751 |

* cited by examiner

*Primary Examiner* — Joseph Schoenholtz
(74) *Attorney, Agent, or Firm* — Winston Hsu

(57) ABSTRACT

A method for fabricating semiconductor device includes the steps of: forming an inter-metal dielectric (IMD) layer on a substrate; forming a trench in the IMD layer; performing a treatment process to transform part of the IMD layer into a damaged layer adjacent to the trench; forming a protective layer on a sidewall of the damaged layer; forming a metal layer in the trench; and removing the damaged layer to form an air gap adjacent to the protective layer.

15 Claims, 5 Drawing Sheets

METHOD FOR REMOVING DAMAGED LAYER EMBEDDED IN A DIELECTRIC LAYER

BACKGROUND OF THE INVENTION

1. Field of the Invention

The invention relates to a method for fabricating semiconductor device, and more particularly, to a method of removing a damaged layer embedded in a dielectric layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the contact area of contact plugs decreases significantly and results in resistance increase. In addition, damaged regions also formed in adjacent dielectric layer during the formation of contact holes to affect the operation of the device. Hence, how to effectively resolve this issue has become an important task in this field.

SUMMARY OF THE INVENTION

According to an embodiment of the present invention, a method for fabricating semiconductor device includes the steps of: forming an inter-metal dielectric (IMD) layer on a substrate; forming a trench in the IMD layer; performing a treatment process to transform part of the IMD layer into a damaged layer adjacent to the trench; forming a protective layer on a sidewall of the damaged layer; forming a metal layer in the trench; and removing the damaged layer to form an air gap adjacent to the protective layer.

According to another aspect of the present invention, a semiconductor device includes: an inter-metal dielectric (IMD) layer on a substrate; a metal interconnection in the IMD layer; an air gap between the metal interconnection and the IMD layer, and a protective layer between the air gap and the metal interconnection. Preferably, a bottom surface of the metal interconnection is lower than a bottom surface of the air gap.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
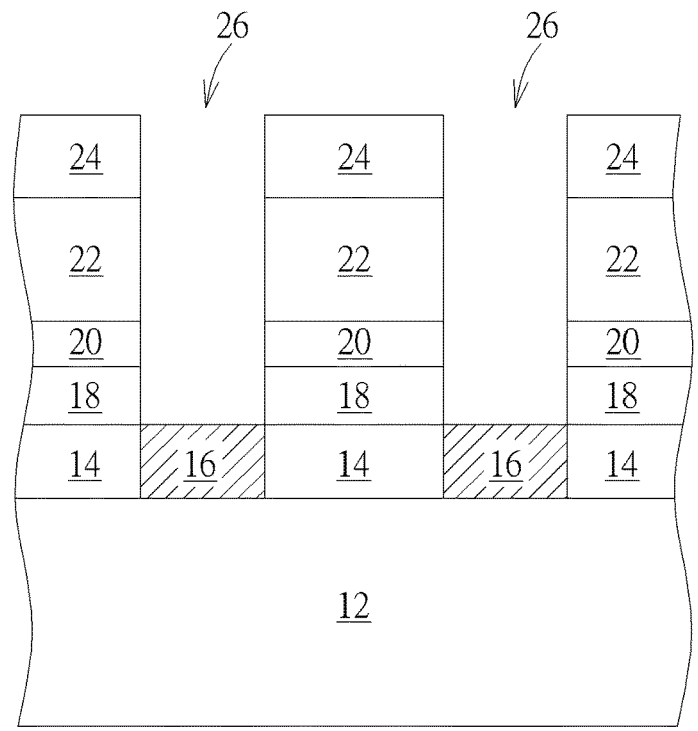
FIGS. 1-8 illustrate a method for fabricating semiconductor device according to an embodiment of the present invention.

Referring to FIGS. 1-8, FIGS. 1-8 illustrate a method for fabricating semiconductor device according to an embodiment of the present invention. As shown in FIG. 1, a substrate 12 is provided and active devices such as MOS transistors and/or other passive devices could be formed on the substrate 12. Specifically, planar-type or non-planar type (such as FinFET) MOS transistors could be formed on the substrate 12, an interlayer dielectric (ILD layer (not shown) could be formed on the MOS transistors, and contact plugs (not shown) could be formed in the ILD layer to electrically connect the MOS transistors, in which the MOS transistors could further include elements such as metal gates, source/drain regions, spacers, epitaxial layers, and CESLs. Since the fabrication of these elements within planar or non-planar MOS transistors is well known to those skilled in the art, the details of which are not explained herein for the sake of brevity.

Next, a dielectric layer 14 is formed on the interlayer dielectric (ILD) layer (not shown) and a plurality of patterned conductive layers 16 or conductive wires are formed in the dielectric layer 14 to electrically connect the contact plugs within the ILD layer, in which a top surface of the patterned conductive layers 16 is even with a top surface of the dielectric layer 14. In this embodiment, each of the patterned conductive layers 16 or conductive wires could be a trench conductor or a via conductor, in which each of the trench conductor or via conductor could further include a barrier layer selected from the group consisting of Ti, TiN, Ta, and TaN and a low resistance metal layer selected from the group consisting of W, Cu, Al, TiAl, and CoWP.

Next, a dielectric stack structure is formed on the substrate 12. For instance, a stop layer 18, a buffer layer 20, an inter-metal dielectric (IMD) layer 22, and a hard mask 24 are sequentially formed on the dielectric layer 14, in which the stop layer 18 is preferably an etch stop layer (ESL) containing nitrogen doped carbide (NDC) or silicon carbon nitride (SiCN), the buffer layer 20 preferably includes tetraethyl orthosilicate (TEOS), and the hard mask 24 is preferably composed of silicon oxide, but not limited thereto. The IMD layer 22 is preferably made of low-k dielectric material including but not limited to for example carbon-containing dielectric material, nitrogen-containing dielectric material, hydrogen-containing dielectric material, or porous dielectric structure such as carbon-containing $SiO_2$, fluorine-containing $SiO_2$, porous $SiO_2$, or porous carbon-containing $SiO_2$.

Next, a photo-etching process is conducted by first forming a patterned resist (not shown) on the hard mask 24 and then conducting an etching process by using the patterned resist as mask to remove part of the hard mask 24, part of the IMD layer 22, part of the buffer layer 20, and part of the stop layer 18 to form trenches 26 exposing the surface of the patterned conductive layers 16 in the dielectric layer 14. Next, a solvent clean process could be conducted to remove residues or impurities on the surface of the trenches 26, in which the solvent clean process could further include a standard RCA clean process, but not limited thereto.

Figure 2:
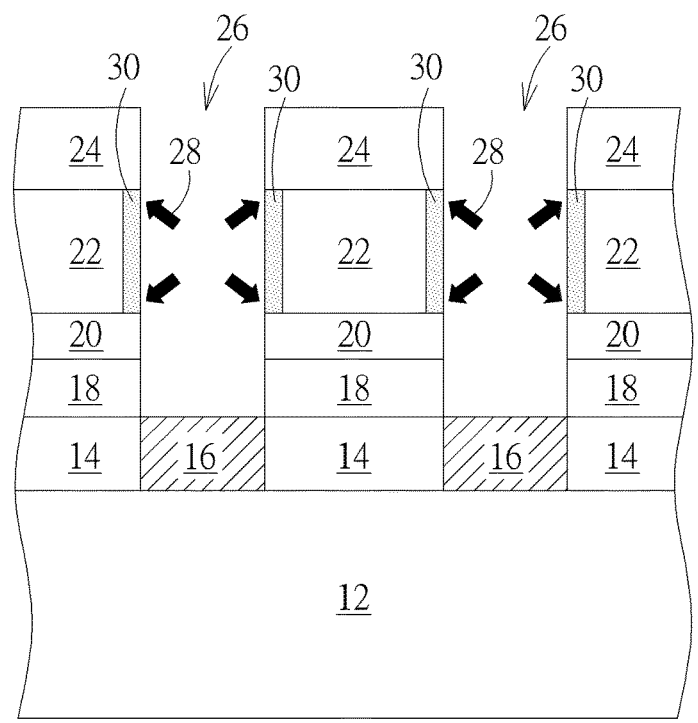

Next, as shown in FIG. 2, a treatment process 28 is conducted to transform part of the IMD layer 22 into damaged layers 30 adjacent to the trenches 26. Specifically, the treatment process 28 is accomplished by conducting a wet clean process using etchant such as hydrogen peroxide ($H_2O_2$) to damage or alter the surface characteristics or property of part of the IMD layer 22. This transforms part of the IMD layer 22 exposed in the trenches 26 into damaged layers 30 while none of hard mask 24, buffer layer 20, and stop layer 18 is affected or damaged during the wet clean process.

Figure 3:
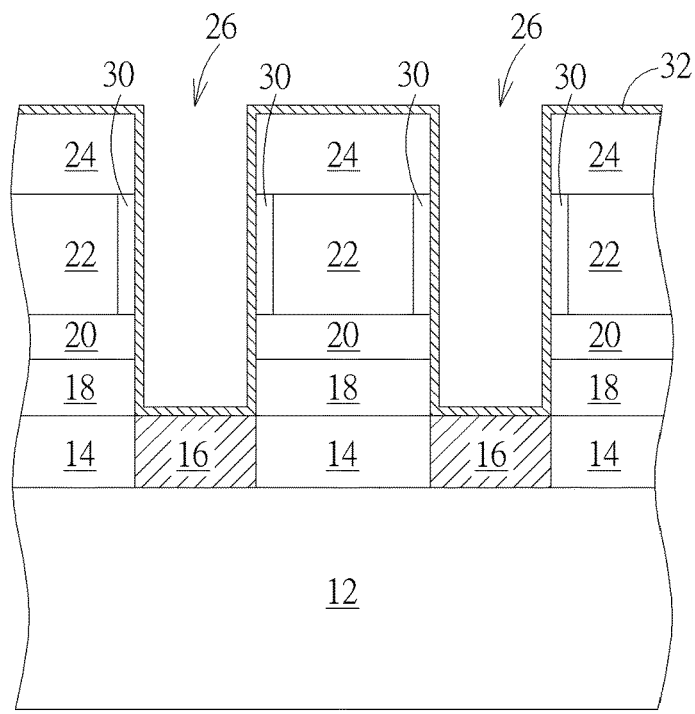

Next, as shown in FIG. 3, a protective layer 32 is deposited in the trenches 26 and covering the top surface of the hard mask 24, sidewalls of the hard mask 24, sidewalls of the damaged layers 30, sidewalls of the buffer layer 20, sidewalls of the stop layer 18, and the surface of the patterned conductive layer 16. In this embodiment, the protective layer 32 is preferably a single layered structure made of material including but not limited to for example aluminum nitride (AlN).

Figure 4:
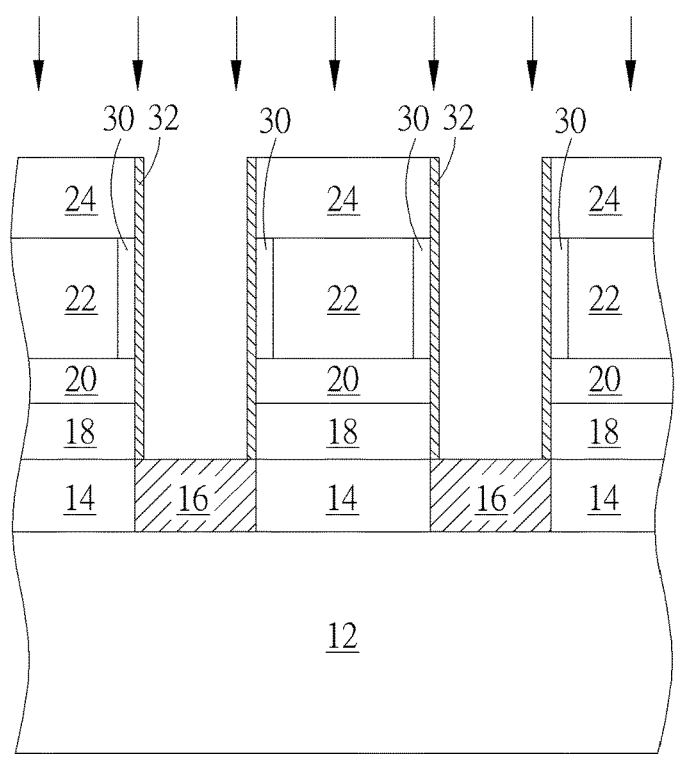

Next, as shown in FIG. 4, a dry etching process such as an anisotropic etching is conducted to remove the protective layer 32 on the top surface of the hard mask 24 and the surface of the patterned conductive layer 16 so that the remaining protective layer 32 is still disposed on the sidewalls of the hard mask 24, the damaged layer 30, the buffer layer 20, and the stop layer 18.

Figure 5:
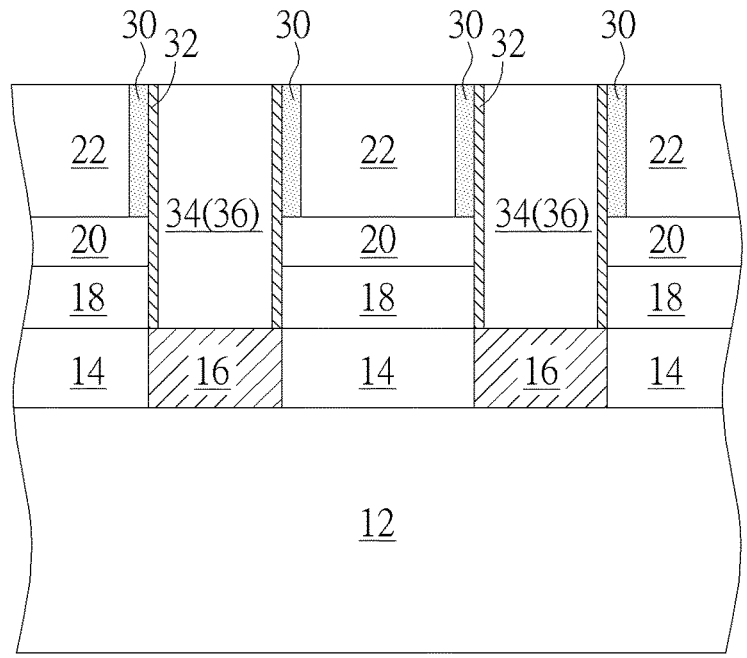

Next, as shown in FIG. 5, a metal interconnective process is conducted to form metal interconnections 34 in the trenches 26 for electrically connecting and directly contacting the patterned conductive layers 16. In this embodiment, the formation of the metal interconnections 34 could be accomplished by sequentially depositing a barrier layer (not shown) and a metal layer 36 on the patterned conductive layer 26, sidewalls of the protective layer 32, and top surface of the hard mask 24 to fill the trenches 26 completely, and then conducting a planarizing process such as chemical mechanical polishing (CMP) process to remove part of the metal layer 36, part of the barrier layer, part of the protective layer 32, and the hard mask 24 to form metal interconnections 34 in the trenches 26 and at the same time expose the damaged layers 30 embedded within the IMD layer 22. Preferably, the top surface of the metal interconnections 34 is even with the top surface of the damaged layers 30, the IMD layer 22, and the protective layer 32. In this embodiment, the barrier layer is preferably selected from the group consisting of Ti, Ta, TiN, TaN, and WN, and the metal layer 36 is preferably selected from the group consisting of Al, Ti, Ta, W, Nb, Mo, and Cu.

Figure 6:
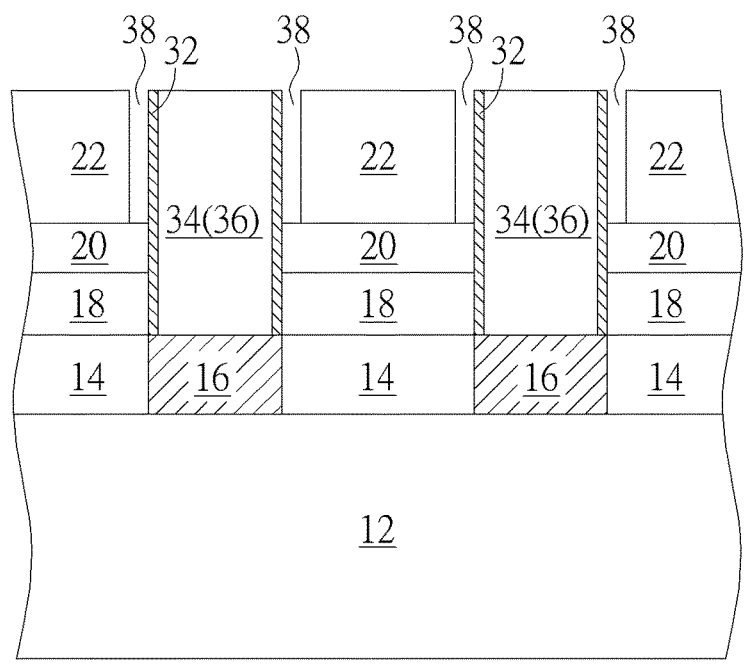

Next, as shown in FIG. 6, an etching process is conducted to remove the damaged layers 30 without removing any of the protective layers 32. This forms air gaps 38 in the location of the original damaged layers 30, in which the bottom of the air gaps 38 preferably exposes the top surface of the buffer layer 20. In this embodiment, the etching process conducted to remove the damaged layers 30 preferably uses an etchant including but not limited to for example hydrofluoric acid (HF).

Figure 7:
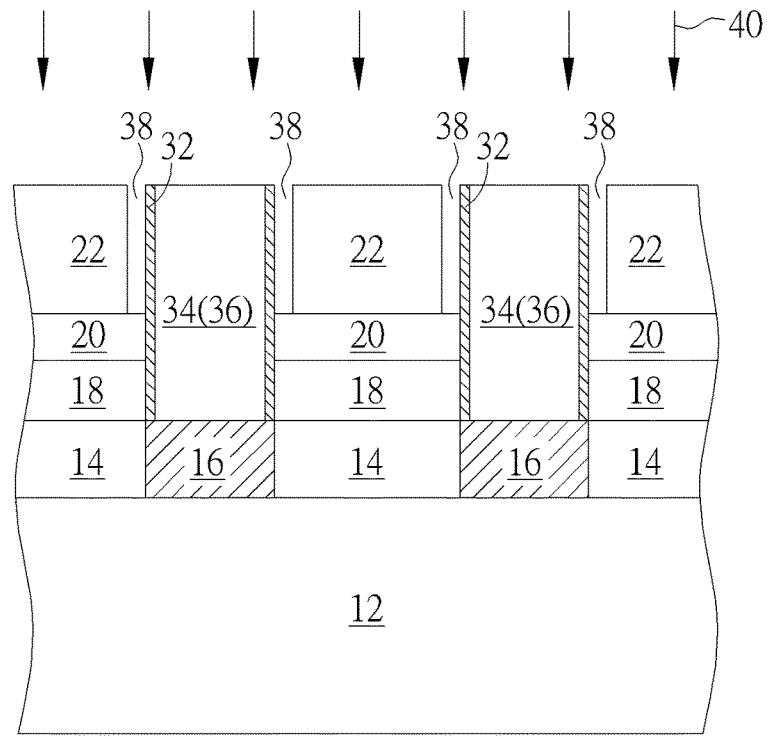

Next, as shown in FIG. 7, an ultraviolet (UV) curing process 40 is conducted to improve the reliability of the overall structure which might have been degraded during the formation of the air gaps 38. In this embodiment, the temperature of the UV curing process 40 is preferably between 300° C. to 400° C. and the duration of the process 40 is preferably between 60 seconds to 140 seconds.

Figure 8:
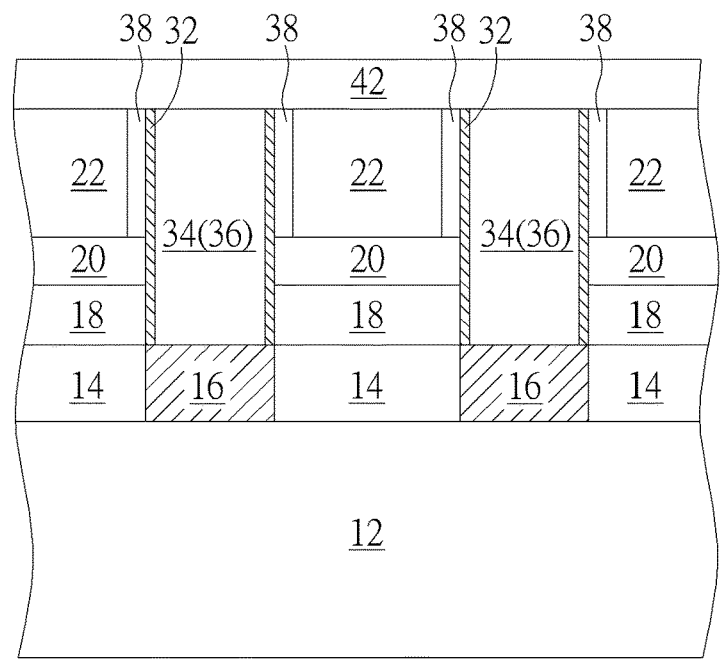

Next, as shown in FIG. 8, an etch stop layer having high compressive stress or namely a high compressive etch stop layer 42 is formed on and covering the IMD layer 22, the air gaps 38, and the metal layer 36 so that each of the air gaps 38 is surrounded by the buffer layer 20, the protective layer 32, the high compressive etch stop layer 42, and the IMD layer 22. In this embodiment, the high compressive etch stop layer 42 preferably includes silicon carbon nitride (SiCN), AlN, or combination thereof. This completes the fabrication of a semiconductor device according to a preferred embodiment of the present invention.

Figure 9:
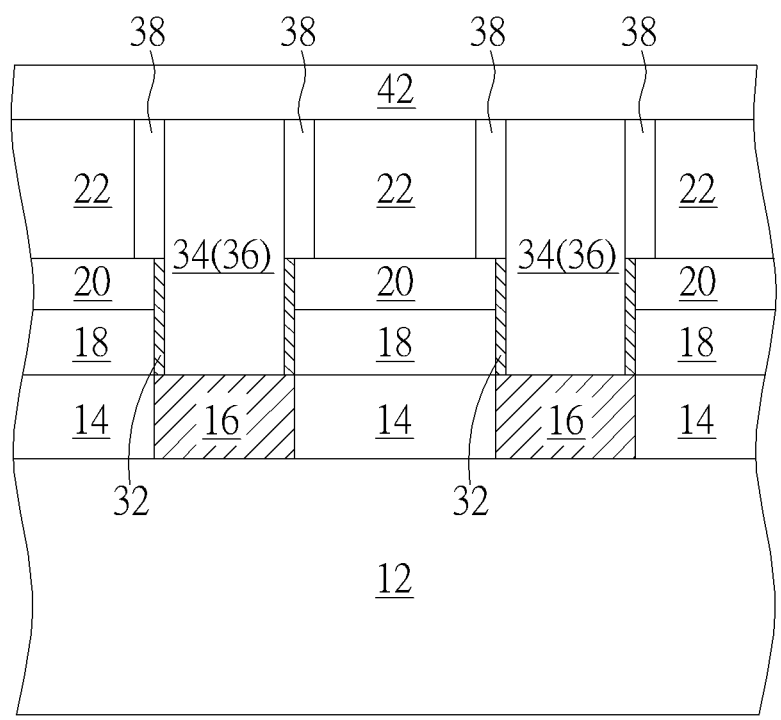
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, tin contrast to removing the damaged layers 30 without removing any protective layer 32 as shown in FIG. 6, it would also be desirable to adjust the selectivity of the etching process such that when HF were used to remove the damaged layers 30, part of the protective layer 32 could be removed at the same time along with the damaged layers 30 to form air gaps 38 between IMD layer 22 and metal interconnections 34, in which the top surface of the remaining protective layer 32 is now even with the top surface of the buffer layer 20. Next, fabrication processes disclosed in aforementioned FIGS. 7-8 could be conducted to sequentially conduct a UV curing process 40 and form a high compressive etch stop layer 42 on the IMD layer 22, the air gaps 38, and the metal interconnections 34. Structurally, in contrast to each of the air gaps 38 in FIG. 8 is surrounded by the buffer layer 20, the protective layer 32, the high compressive etch stop layer 42, and the IMD layer 22, each of the air gaps 38 in this embodiment is preferably surrounded by the buffer layer 20, the protective layer 32, the metal interconnection 34, the high compressive etch stop layer 42, and the IMD layer 22.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming an inter-metal dielectric (IMD) layer on a substrate;
    forming a trench in the IMD layer;
    performing a treatment process to transform part of the IMD layer into a damaged layer adjacent to the trench, wherein the treatment process comprises performing a wet etching process to etch part of the IMD layer for forming the damaged layer;
    forming a protective layer on a sidewall of the damaged layer;
    forming a metal layer in the trench; and
    removing the damaged layer to form an air gap adjacent to the protective layer.

2. The method of claim 1, further comprising:
    forming a dielectric layer on the substrate, wherein the dielectric layer comprises a patterned conductive layer therein;
    forming a stop layer on the dielectric layer;
    forming a buffer layer on the stop layer;
    forming the IMD layer on the buffer layer; and
    forming the trench in the buffer layer, the stop layer and the IMD layer to expose the patterned conductive layer.

3. The method of claim 2, wherein a top surface of the patterned conductive layer is even with a top surface of the dielectric layer.

4. The method of claim 2, further comprising:
    forming the protective layer on sidewalls of the damaged layer, the buffer layer, and the stop layer;
    forming the metal layer to fill the trench; and
    performing a planarizing process to remove part of the metal layer for forming a metal interconnection.

5. The method of claim 2, further comprising forming a compressively stressed etch stop layer on the IMD layer and the metal layer after forming the air gap.

6. The method of claim 5, wherein the air gap is surrounded by the buffer layer, the protective layer, the compressively stressed etch stop layer, and the IMD layer.

7. The method of claim 5 further comprising performing a ultraviolet (UV) curing process after forming the air gap and before forming the compressively stressed etch stop layer.

8. The method of claim 1, further comprising using hydrogen peroxide ($H_2O_2$) to perform the wet clean process.

9. A semiconductor device, comprising:
an inter-metal dielectric (IMD) layer on a substrate;
a metal interconnection in the IMD layer;
an air gap between the metal interconnection and the IMD layer, wherein a bottom surface of the metal interconnection is lower than a bottom surface of the air gap; and
a protective layer between the air gap and the metal interconnection, a stop layer between the IMD layer and the substrate, a buffer layer between the stop layer and the IMD layer, wherein bottom surfaces of the protective layer and the metal interconnection are coplanar.

10. The semiconductor device of claim 9, further comprising a compressively stressed etch stop layer on the IMD layer and the metal interconnection.

11. The semiconductor device of claim 10, wherein the air gap is surrounded by the buffer layer, the protective layer, the compressively stressed etch stop layer, and the IMD layer.

12. The semiconductor device of claim 9, further comprising a dielectric layer between the IMD layer and the substrate, wherein the dielectric layer comprises a patterned conductive layer therein.

13. The semiconductor device of claim 12, wherein a top surface of the patterned conductive layer is even with a top surface of the dielectric layer.

14. The semiconductor device of claim 12, wherein the metal interconnection contacts the patterned metal layer directly.

15. The semiconductor device of claim 9, wherein the protective layer comprises aluminum nitride (AlN).

* * * * *